(12) United States Patent
Kundalgurki et al.

(10) Patent No.: US 8,709,848 B2
(45) Date of Patent: Apr. 29, 2014

(54) METHOD FOR ETCHED CAVITY DEVICES

(75) Inventors: Srivatsa G. Kundalgurki, Austin, TX (US); Scott Dye, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 179 days.

(21) Appl. No.: 13/088,100

(22) Filed: Apr. 15, 2011

(65) Prior Publication Data

US 2012/0264249 A1  Oct. 18, 2012

(51) Int. Cl.
 *H01L 21/02* (2006.01)
 *H01L 21/3065* (2006.01)

(52) U.S. Cl.
 USPC  438/50; 438/715; 257/E21.218; 257/E21.002

(58) Field of Classification Search
 None
 See application file for complete search history.

(56) References Cited

U.S. PATENT DOCUMENTS

| 4,889,590 | A  | 12/1989 | Tucker et al. |
| 7,765,679 | B2 | 8/2010  | Yao et al.    |

| 2005/0017276 | A1* | 1/2005 | Ikushima et al. | 257/293 |
| 2007/0052046 | A1* | 3/2007 | Chu et al.      | 257/415 |
| 2007/0218585 | A1* | 9/2007 | Robert          | 438/106 |

OTHER PUBLICATIONS

Ngo, H.D., et al., Corner Rounding to Strengthen Silicon Pressure Sensors Using DRIE, IEEE Sensors 2008 Conference, May 2008.

* cited by examiner

*Primary Examiner* — Seahvosh Nikmanesh
(74) *Attorney, Agent, or Firm* — Ingrassia Fisher & Lorenz, P.C.

(57) ABSTRACT

MEMS devices (40) using etched cavities (42) are desirably formed using multiple etching steps. Preliminary cavities (20) formed by locally anisotropic etching to nearly the final depth have irregular (46) sidewalls (44) and steep and/or inconsistent sidewall (44) to bottom (54) intersection angles (48). This leads to less than desired cavity diaphragm (26) burst strengths. Final cavities (42) with smooth sidewalls (50), smaller and consistent sidewall (50) to bottom (54) intersection angles (58), and having more than doubled cavity diaphragm (26) burst strengths are obtained by treating the preliminary cavities (20) with TMAH etchant, preferably relatively dilute TMAH etchant. In a preferred embodiment, a cleaning step is performed between the etching step and the TMAH treatment step to remove any anisotropic etching by-products present on the preliminary cavities' (20) initial sidewalls (44). The multi-step cavity etching procedure is especially useful for forming robust MEMS pressure sensors, but is applicable to any type of MEMS device.

20 Claims, 4 Drawing Sheets

METHOD FOR ETCHED CAVITY DEVICES

FIELD OF THE INVENTION

Embodiments of this invention relate generally to arrangements and methods for etching cavities in substrates, especially semiconductor substrates, and devices embodying etched cavities.

BACKGROUND OF THE INVENTION

There is a need in the electronic arts, especially semiconductor arts, to etch cavities of various depths into substrates. Etched cavities are often used to provide thin diaphragms in connection with micro-electro-mechanical system ("MEMS") elements. For example and not intended to be limiting, by placing a deflection sensor on such a thin diaphragm, a pressure sensor MEMS element can be created. It is common to have other electronic and/or optical devices, integrated circuits (ICs), and various other sensors or actuators associated with MEMS elements. As used herein, the terms "MEMS", "MEMS element" and "MEMS device" are intended to include such other devices, ICs, sensors and actuators.

BRIEF DESCRIPTION OF THE DRAWINGS

Embodiments of the invention will be better understood from a reading of the following detailed description, taken in conjunction with the accompanying figures in the drawings in which like numerals denote like or analogous elements, and wherein.

DETAILED DESCRIPTION OF THE INVENTION

Figure 1:
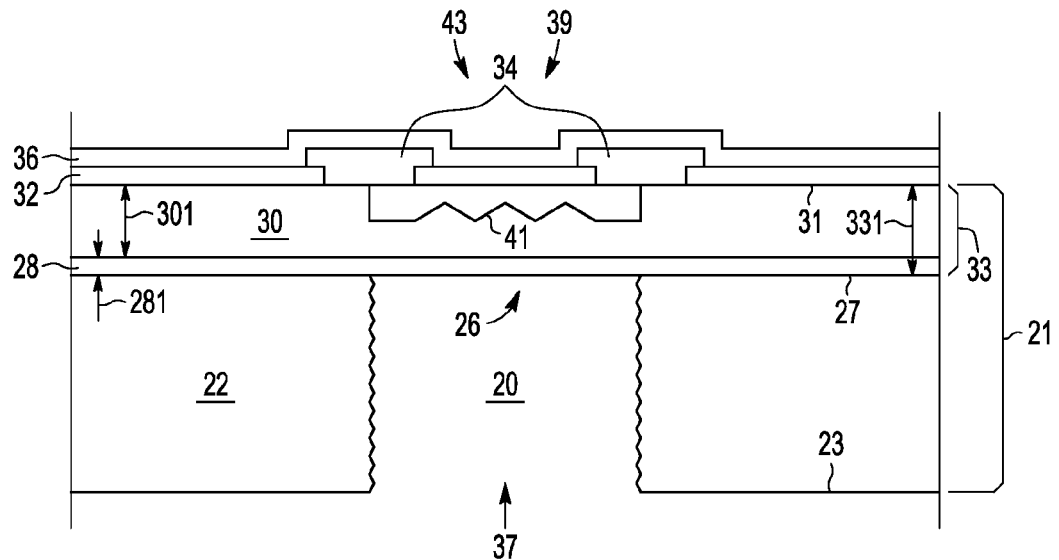
FIG. 1 is a simplified cross-sectional conceptual view of a pressure sensor MEMS device employing an etched cavity.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the terms "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate" and "substrate wafer" are intended to include single crystal structures, polycrystalline structures, amorphous structures, thin film structures, layered structures as for example and not intended to be limiting, combinations of dielectric and SC layers or materials including but not limited to semiconductor-on-insulator (SOI) structures, and combinations thereof. For convenience of explanation and not intended to be limiting, electronic structures and methods of fabrication are described herein for substrates employing silicon, but persons of skill in the art will understand that other semiconductors and composite materials may also be used.

In the electronic arts, cavities are etched into substrates for a variety of purposes. For example and not intended to be limiting, various MEMS devices can be formed by etching cavities in substrates, often semiconductor wafers. The cavity is typically etched from a first surface part way through the substrate, leaving a comparatively thin diaphragm of the substrate material proximate an opposed second surface. By placing sensors or actuators on or near such diaphragm a wide variety of MEMS devices can be created. For example, if such diaphragm is exposed to pressure or other force, it can deflect and such deflection measured, thereby providing a force or pressure sensing MEMS element. If such diaphragm is exposed to fluid, it is more sensitive to heat transfer and can be used to form a fluid flow sensor or temperature sensor. If such diaphragm is coupled to an actuator, it can be used to form a variety of useful devices such as flexible mirrors, etc. These are non-limiting examples of the wide variety of useful MEMS devices that can be formed using etched cavities. For convenience of explanation, the etching of cavities associated with the manufacture of MEMS devices is described herein, by way of example, for the case of a simple pressure sensor. However, persons of skill in the art will understand that the various embodiments illustrated herein apply generally to all types of MEMS elements and other structures employing etched cavities and are not limited merely to pressure sensors.

FIG. 1 is a simplified cross-sectional conceptual view of pressure sensor MEMS device 19 employing etched cavity 20. MEMS device 19 is formed in substrate 21. Substrate 21 comprises in this example, semiconductor (e.g., silicon) body 22 having lower surface 23 and upper surface 27. Dielectric layer 28 (e.g., silicon oxide) of thickness 281 is formed on upper surface 27. Overlying dielectric layer 28 is layer 30 (e.g., silicon or silicon-germanium or other semiconductor or resistive or piezo-resistive material) of thickness 301 having upper surface 31. Layers 28, 30 form composite layer 33 having thickness 331 of which central portion 26 above cavity 20 acts as the diaphragm of MEMS device 19. For convenience of description, central portion 26 of composite layer 33 is also referred to as diaphragm 26. Overlying layer 30 is dielectric layer 32 (e.g., silicon oxide). Also overlying layer 30 of diaphragm 26 are, in this example, metal contacts 34 and dielectric passivation layer 36.

As pressure or force 37 is applied to diaphragm 26, the deflection of diaphragm 26 causes, for example, resistance 41 of the central portion of layer 30 of diaphragm 26 to change. This change can be detected via metal contacts 34. This is intended merely as an example of device 39 located within, on, over, or a combination thereof of central part 43 of diaphragm 26 proximate surface 31, that can be used to detect deflection of diaphragm 26. In various other embodiments, other types of device 39 may be used. Thus, device 39 may be more generally referred to as micro-electro-mechanical system (MEMS) element 39, where MEMS element 39 may be any type of electronic or electro-mechanical or electro-optical device proximate location 43 that interacts with diaphragm 26. Non-limiting examples are mass, force, pressure, flow, temperature, optical, electrical and magnetic sensors and actuators, and references to MEMS element 39 is intended to include these and other physical phenomena and functions. References to MEMS device 19 and references to later described MEMS device 40 are intended to include such other functions as well as the pressure sensor function illustrated herein.

Figure 2:
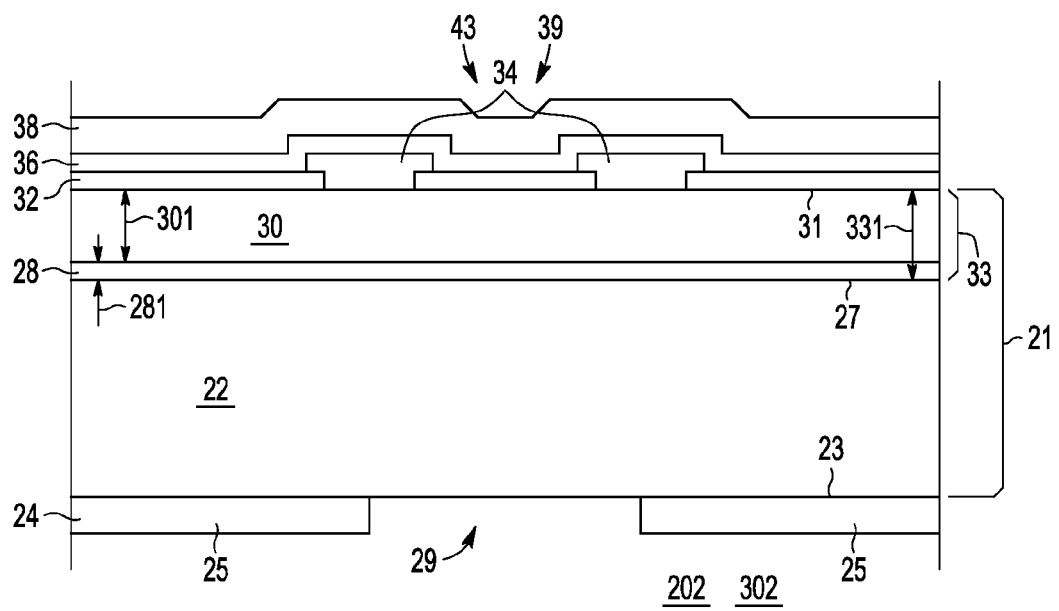
FIGS. 2-4 are simplified cross-sectional views of an etched cavity MEMS device analogous to that of FIG. 1, during various stages of manufacture, illustrating various difficulties than can arise and how they can be minimized or avoided according to an embodiment of the invention.
Figure 3:
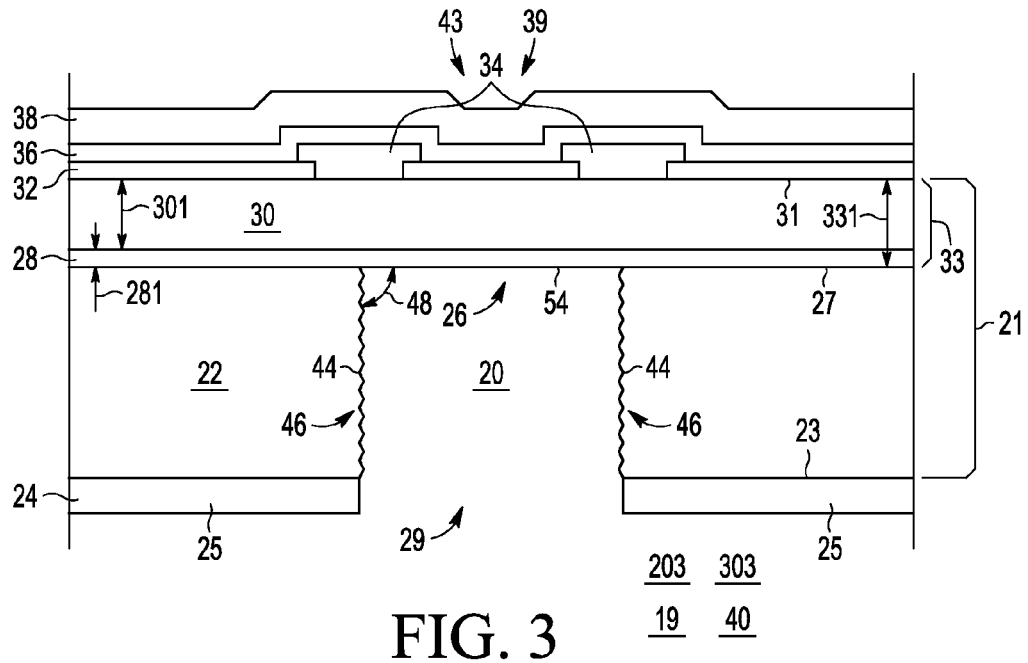
Figure 4:
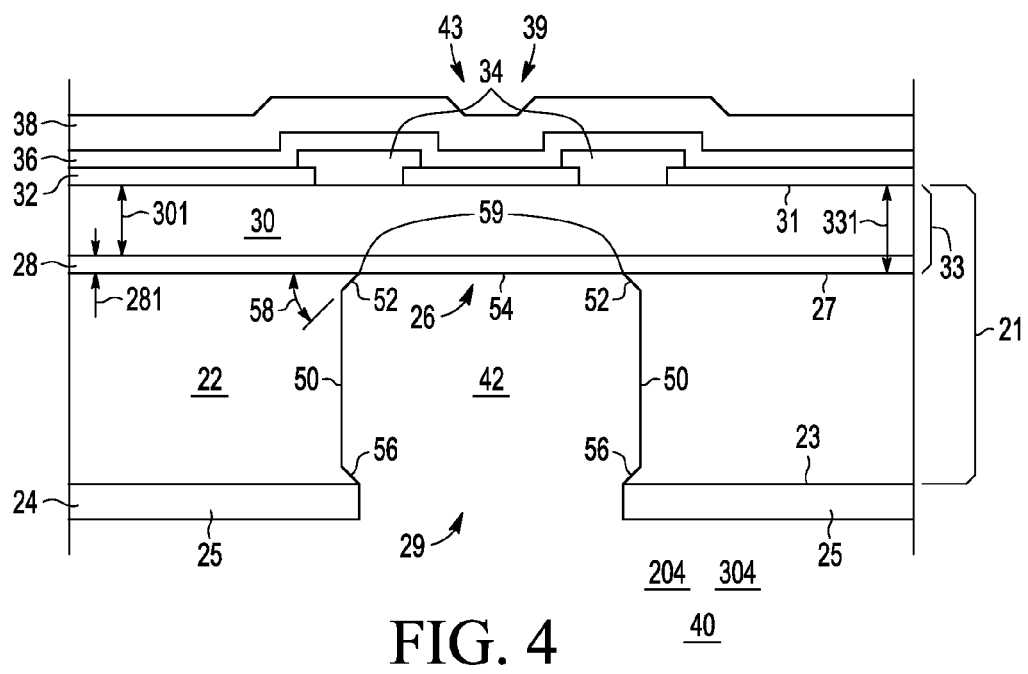

It has been found that the robustness of MEMS device 19 and the manufacturing yield associated with MEMS device 19 depend significantly on the properties of cavity 20 and the process used in its formation. FIGS. 2-3 are simplified cross-sectional views of etched cavity MEMS device 19, 40 analogous to MEMS device 19 of FIG. 1, during stages 202-203 of manufacture, illustrating various cavity etching related difficulties than can arise and how they can be minimized or avoided, according to embodiments of the invention. FIG. 4 showing further manufacturing stage 204 beyond stage 203 of FIG. 3 and applies to improved MEMS device 40, according to an embodiment of the present invention. Where appropriate, the same reference numbers are used in FIGS. 2-4 as in FIG. 1 to identify analogous elements, and the descriptions of such analogous elements in connection with FIG. 1 are incorporated herein by reference.

Referring now to manufacturing stage 202 of FIG. 2, substrate 21 is provided, comprising body 22 and layers 28 and 30. Overlying substrate 21 are layers or contacts 32, 34, 36, preferably with MEMS sensor element 39 already included. Dielectric layer 28 is desirable but not essential. For convenience of description, it is assumed hereafter that sensor element 39 (including layers, contacts and/or regions 32, 34, 36) has already been formed, but this is not essential and sensor element 39 and the various layers and contacts associated therewith may be provided later in the manufacturing process, even after formation of cavity 42 of FIG. 4. In manufacturing stage 202, sacrificial protection layer 38 is desirably provided over MEMS element 39, and mask layer 25 is provided on lower surface 23 of body 22. The purpose of layer 38 is to protect MEMS element 39 (and preferably also surrounding areas) during etching of cavity 20, 42 of FIGS. 3-4 analogous to cavity 20 of FIG. 1. Phosphorous doped silicate glass (PSG), boron doped silicate glass (BSG), and other dielectric materials having etch rates larger than thermal silicon oxide are examples of suitable materials for sacrificial protection layer 38 and mask layer 25, but other materials of equivalent etch resistance can also be used. Mask layer 25 has opening 29 formed therein defining the desired location of cavity 20, 42 of FIGS. 3-4. Because of the nature of etchants used to form cavity 20, 42 of FIGS. 3-4, mask layer 25 is preferably a hard mask. Structure 302 results from manufacturing stage 202.

Referring now to manufacturing stage 203 of FIG. 3, structure 302 is preferably subjected to localized anisotropic etching to form preliminary cavity 20 having preliminary sidewalls 44 extending substantially through body 22, desirably but not essentially, to dielectric layer 28 when present. Any type of anisotropic etching may be used, varying according to the material of body 22 and the arrangement used for laterally localizing the etching. Reactive ion etching (RIE), particularly relatively high rate deep reactive ion etching (DRIE), is preferred, but other etching means may also be used. The Pegasus Chamber manufactured by SPP Process Technology Systems, Ltd of San Jose, Calif., USA and Newport NP182TA, UK is a non-limiting example of a suitable RIE chamber and reagents for anisotropic etching of semiconductors such as silicon (as well as other materials) are well known in the art. Structure 303 results from manufacturing stage 203. One of the consequences of such etching is that preliminary sidewalls 44 of preliminary cavity 20 often exhibit significant irregularities 46 and intersect bottom 54 of cavity 20 at comparatively steep and sometimes uncertain angle 48. A problem encountered with MEMS devices 19 formed in this fashion, is that the burst or fracture strength of diaphragm 26 of such MEMS devices when used, for example, as pressure or force sensors or in actuators is often less than desired, as is explained more fully later.

Referring now to manufacturing stage 204 of FIG. 4, structure 303 containing preliminary cavity 20 with preliminary sidewalls 44 is subjected to further etching using tetra-methyl-ammonium hydroxide (TMAH). TMAH concentrations in the range of about 1 to 40 weight percent TMAH in water are useful, concentrations in the range of about 2 to 10 weight percent TMAH in water are convenient, and concentrations in the range of about 2 to 3 weight percent TMAH in water are preferred. TMAH is available from Air Products and Chemicals, Inc., Allentown, Pa., USA and other suppliers. While it is known to etch semiconductors (e.g., silicon) using TMAH, it has typically been used as an anisotropic (e.g., substantially vertical) etch. Its usefulness to smooth out the irregularities caused by RIE and other anisotropic etching, and to provide improved cavity sidewall to bottom intersection angles, has not previously been recognized.

It has been found that TMAH etching of anisotropically etched preliminary cavity 20 substantially mitigates or removes irregularities 46 on preliminary sidewalls 44 of cavity 20 of FIG. 3, thereby providing substantially smoother final sidewalls 50 of final cavity 42 of FIG. 4. It has been further found that TMAH etching also provides more gradual and consistent sidewall transition portion 52 between near vertical final sidewalls 50 and approximately horizontal bottom 54 of cavity 42, e.g. at dielectric layer 28. Somewhat similar sidewall transition 56 is also found at the top of cavity 42 where it meets surface 23 of body 22. Angle 58 is usefully in the range of about 20 to less than 90 degrees, more conveniently in the range of about 40 to 70 degrees and preferably in the range of about 50 to 60 degrees. Where body 22 is [100] oriented single crystal silicon, angle 58 is typically 54.74 degrees, but other values for angle 58 generally in the ranges noted above are also useful. Such angles and the manufacturing consistency of such angles are favorable for reducing stress concentration in diaphragm 26 of MEMS device 40 around perimeter 59 of final cavity 42. Perimeter 59 is where sidewall portion 52 of body 22 at the periphery of cavity 42 meets cavity bottom or floor 54. This further capability of TMAH cavity etching has not previously been recognized. Structure 304 results from manufacturing stage 204. Layers 38 and 25 may be removed or left in place for subsequent manufacturing operations as needed.

As a consequence of the changes in the properties of cavity 42 obtained by using the TMAH etch following the anisotropic etch, the burst strength of MEMS device 40 is much improved compared to the burst strength of MEMS device 19 that has not received the TMAH etch. Experimental comparisons are provided in Table I below. In these tests, the higher pressure was applied to the cavity side of diaphragm 26.

TABLE I

BURST PRESSURE FOR DIFFERENT CAVITY ETCH PROCEDURES

| | ETCH PROCESS USED | |
|---|---|---|
| | RIE ETCH ONLY | RIE + TMAH ETCH |
| MINIMUM DIFFERENTIAL BURST PRESSURE (kPa) | ~180 | ~650 |
| MAXIMUM DIFFERENTIAL BURST PRESSURE (kPa) | ~315 | ~900 |

It will be apparent that the combination of anisotropic cavity etch followed by TMAH cavity etch improves the minimum burst pressure differential by ~260 percent and improves the maximum burst pressure differential by ~186 percent. This is a significant advance in the art.

In order to obtain maximum benefit from the TMAH etch, it is desirable to insert between the anisotropic etch and the TMAH etch a surface cleaning step to remove any residual contamination, e.g., surface oxides that may be present on preliminary sidewalls 44 of preliminary cavity 20 after RIE etching. Hydrofluoric acid (HF) is a useful cleaning agent. Concentration ratios of water to hydrofluoric acid ($H_2O$:HF) by volume in the range of about $H_2O$:HF=500:1 to $H_2O$:HF=25:1 are useful, concentration ratios of about $H_2O$:HF=200:1 to $H_2O$:HF=50:1 are convenient and concentration ratios of about $H_2O$:HF=125:1 to $H_2O$:HF=75:1 are preferred. Room temperature cleaning times in the range of about 10 to 100 seconds are useful, cleaning times in the range of about 20 to 50 seconds are convenient and cleaning times in the range of about 30 to 40 seconds are preferred. In general, for such cavity surface cleaning step, the combination of etchant concentration and etch or cleaning time should be chosen so that, if present, dielectric layer 28 exposed on cavity bottom 54 is not significantly affected.

Figure 5:
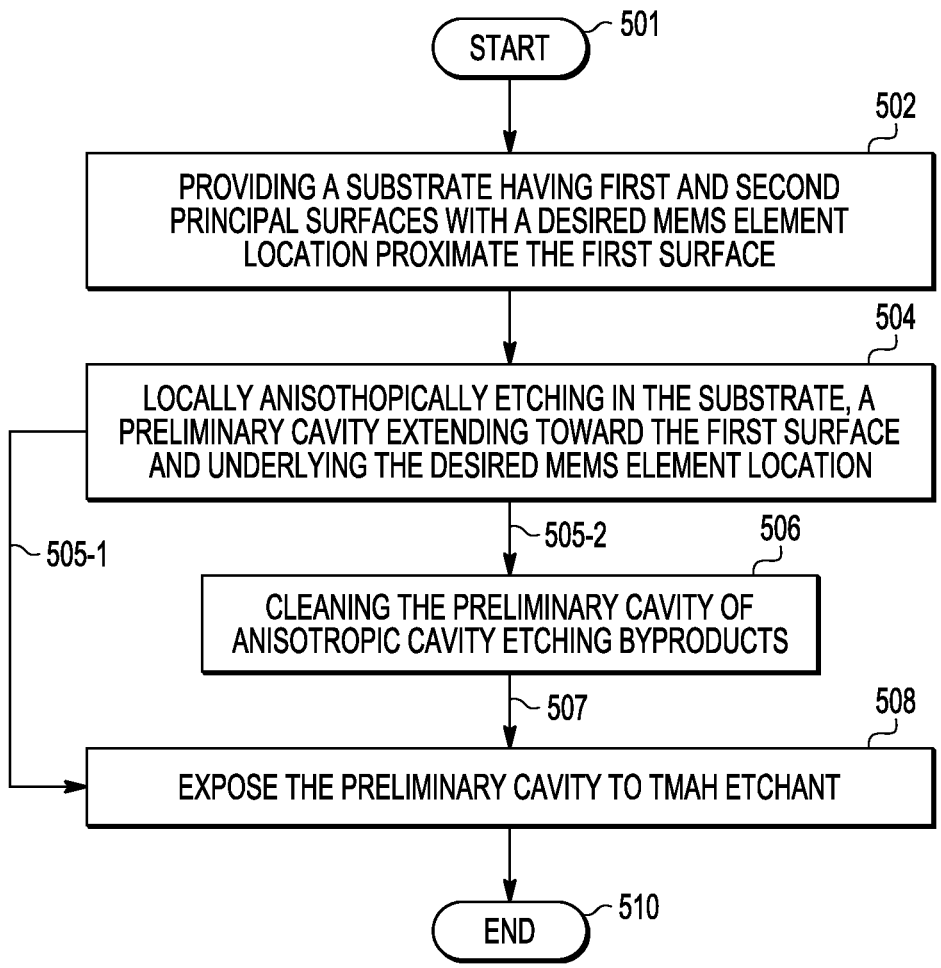
FIGS. 5-6 are simplified block diagrams of methods of producing MEMS devices employing etched cavities, according to further embodiments of the invention.
Figure 6:
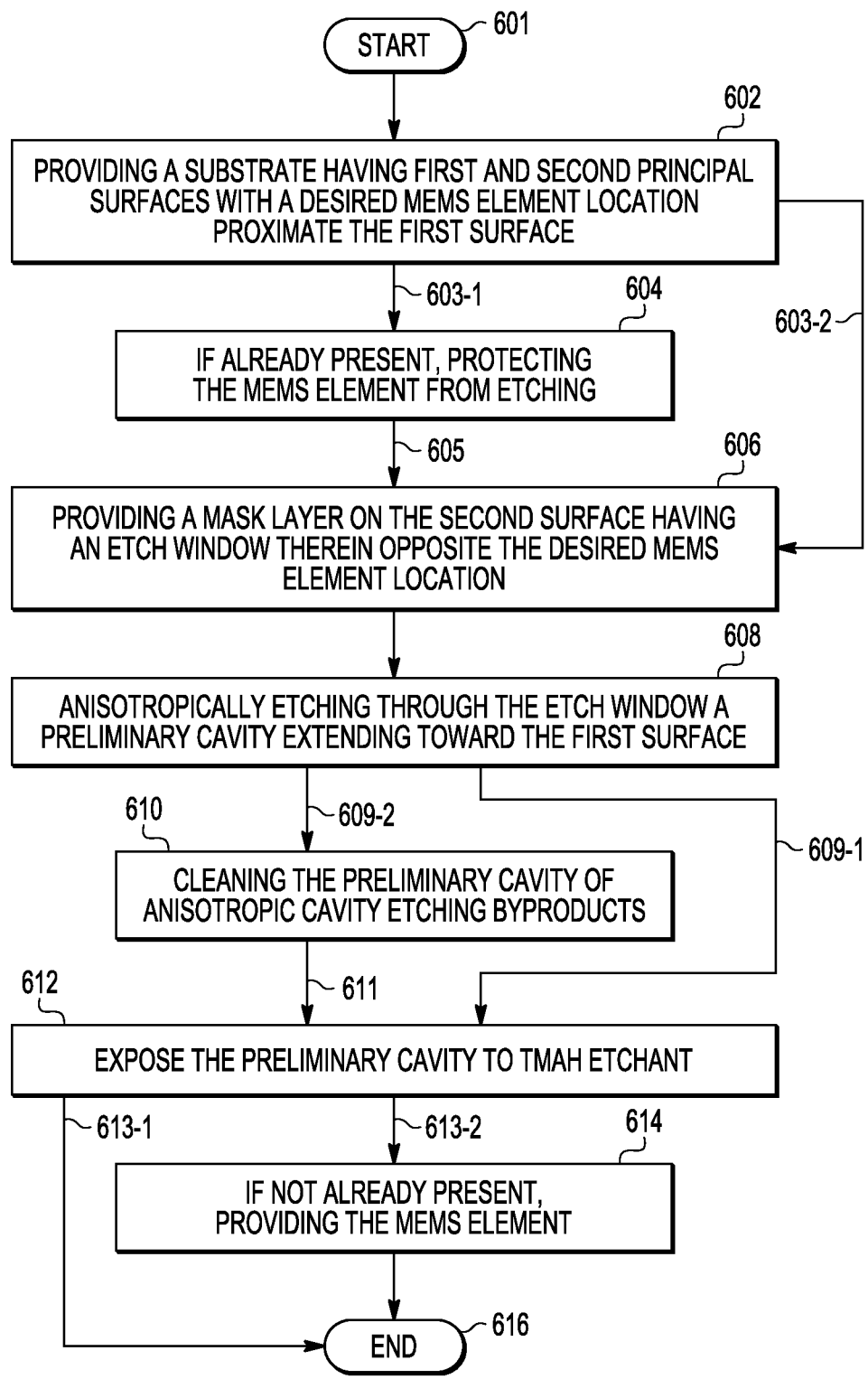

FIGS. 5 and 6 are simplified block diagrams of methods 500 and 600, respectively, of producing a MEMS device 40 comprising cavity 42 by etching substrate 21, according to further embodiments of the invention. Referring now to FIG. 5, method 500 begins with START 501 and initial step 502 wherein there is provided a substrate (21) having first (31) and second (23) principal surfaces with a desired MEMS element (39) location (43) proximate the first surface (31). The MEMS element (39) may have been provided prior to of during manufacturing stage 502 or may be provided after manufacturing stage 502. Either arrangement is useful. In step 504, a preliminary cavity (20) is locally anisotropically etched in the substrate (21) extending toward the first surface (31) and underlying the desired MEMS element (39) location (43). In one embodiment according to path 505-1, method 500 proceeds to step 508 wherein the preliminary cavity (20) is exposed to TMAH etchant (e.g., as described above), and then to END 510. In another embodiment according to path 505-2, method 500 proceeds from step 504 to step 506 wherein the preliminary cavity (20) is cleaned of anisotropic cavity etching byproducts and then along path 507 to step 508 and then to END 510. Either arrangement is useful. As has been previously explained, the exposure of preliminary cavity 20 to TMAH in step 508 reduces irregularities 46 on preliminary sidewalls 44 thereby providing smoother final sidewalls 50. This TMAH exposure also decrease intersection angle 58 between bottom 54 of final cavity 42 and final sidewalls 50, 52, e.g. compared to angle 48 between preliminary sidewalls 44 and cavity bottom 54. This is very useful.

Referring now to FIG. 6, method 600 begins with START 601 and initial step 602 wherein there is provided a substrate (21) having first (31) and second (23) principal surfaces with a desired MEMS element (39) location (43) proximate the first surface (31). The MEMS element (39) may have been provided prior to manufacturing stage 602 or may be provided after manufacturing stage 602. Either arrangement is useful. If the MEMS element (39) is already present, then according to a further embodiment via path 603-1, method 600 proceeds to step 604 wherein such MEMS element (39) is protected from etching, and then via path 605 to step 606 described hereafter. If the MEMS element (39) is not already present, then according to a still further embodiment, method 600 proceeds via path 603-2 to step 606 wherein there is provided a mask layer (25) on the second surface (23) having therein an etch window (29) opposite the desired MEMS element location (43). Method 600 then proceeds from step 606 to step 608 wherein a preliminary cavity (20) extending toward the first surface (31) is anisotropically etched through the mask window (29). According to a yet further embodiment, method 600 proceeds via path 609-1 from step 608 to step 612 wherein the preliminary cavity (20) is exposed to TMAH etchant (e.g., as has already been described). According to a still yet further embodiment, method 600 proceeds via path 609-2 from step 608 to step 610 wherein the preliminary cavity (20) is cleaned of anisotropic etching byproducts, and then via path 611 to step 612 already described. If the MEMS element (39) is already present, then according to path 613-1 method 600 proceeds from step 612 to END 616. If the MEMS element (39) is not already present, then in step 614 the MEMS element (39) can be provided and method 600 then proceeds to END 616. Either arrangement is useful. Step 614 may be carried out at any time during method 600 between START 601 and END 616. As has been previously explained, the exposure of preliminary cavity 20 to TMAH in step 612 reduces irregularities 46 on preliminary sidewalls 44 thereby providing smoother final sidewalls 50. This TMAH exposure also decreases intersection angle 58 between bottom 54 of final cavity 42 and final sidewalls 50, 52, e.g. compared to angle 48 between preliminary sidewalls 44 and cavity bottom 54. This is very useful.

According to a first embodiment, there is provided a method (500, 600) for producing a MEMS device (40) comprising, for a substrate (21) having first (31) and second (23) principal surfaces with a desired MEMS element (39) location (43) proximate the first (31) surface, locally anisotropically etching in the substrate (21) a preliminary cavity (20) extending toward the first surface (31) and underlying the desired MEMS element (39) location (43), and exposing the preliminary cavity (20) to tetra-methyl-ammonium hydroxide (TMAH) etchant. According to a further embodiment, the method further comprises prior to the etching step, providing a protective layer (38) over at least the MEMS element (39) location (43). According to a still further embodiment, the method further comprises prior to the etching step, providing a mask layer (25) having an etch window (29) therein on the second surface (23) opposite the desired MEMS element (39) location (43), and thereafter performing the etching step through the etch window (29). According to a yet further embodiment, the etching step comprises reactive ion etching. According to a still yet further embodiment, the method further comprises prior to the exposing step, cleaning the preliminary cavity (20) of anisotropic cavity etching byproducts. According to a yet still further embodiment, following the exposing step, a subsequent cavity (42) is formed having a sidewall portion (52) making an angle (58) with a bottom (54) of the subsequent cavity (42) in the range of about 20 to less than 90 degrees. According to another embodiment, the TMAH etchant comprises TMAH concentrations in the range of about 1 to 40 weight percent TMAH in water. According to a still another embodiment, the TMAH etchant comprises TMAH concentrations in the range of about 2 to 10 weight percent TMAH in water.

According to a second embodiment, there is provide a method (500, 600) for etching a cavity (42) in a substrate (21), comprising, for a semiconductor substrate (21) having a first principal surface (31) and an opposed second principal surface (23), anisotropically locally etching a preliminary cavity (20) in the substrate (21) extending from the second principal surface (23) toward the first principal surface (31), and exposing the preliminary cavity (20) to a tetra-methyl-ammonium hydroxide (TMAH) etchant thereby forming a final cavity (42) having a smoother final sidewall (50). According to a further embodiment, the smoother final sidewall (50) has a portion (52) making an angle (58) with a bottom (54) of the final cavity (42) in the range of about 20 to less than 90 degrees. According to a still further embodiment, the TMAH etchant comprises TMAH concentrations in the range of about 1 to 40 weight percent TMAH in water. According to a yet further embodiment, the TMAH etchant comprises TMAH concentrations in the range of about 2 to 10 weight percent TMAH in water. According to a still yet further embodiment, the etching step comprises reactive ion etching. According to a yet still further embodiment, the method further comprises, prior to the exposing step, cleaning preliminary sidewalls (44) of the preliminary cavity (20) of anisotropic cavity etching byproducts. According to another embodiment, the cleaning step comprises using a water-hydrofluoric acid mixture having a concentration ratio in the range of about $H_2O:HF=500:1$ to $H_2O:HF=25:1$.

According to a third embodiment, there is provided a method (500, 600) for producing a pressure sensor device (40) comprising, for a substrate (21) having a substantially silicon body (22) abutting a first principal surface (23) of the substrate (21) and having a second principal surface (31) spaced from the first principal surface (23) and having a pressure sensor element (39) location (43) proximate the second principal surface (31), locally anisotropically etching a preliminary cavity (20) extending partly through the silicon body (22) toward the second principal surface (31), wherein the preliminary cavity underlies the pressure sensor element (39) location (43) and has a preliminary sidewall (44), and exposing the preliminary sidewall (44) of the preliminary cavity (20) to tetra-methyl-ammonium hydroxide (TMAH) etchant to provide a final cavity (42) underlying the pressure element (39) location (43). According to a further embodiment, the final cavity (42) has a final sidewall (50) having a portion (52) making an angle (58) with a bottom (54) of the final cavity (42) in the range of about 20 to less than 90 degrees. According to a still further embodiment, the method further comprises to the etching step, providing a mask layer (25) on the first principal surface (23) having an etch window (29) therein opposite the pressure sensor element (39) location (43), and thereafter etching the preliminary cavity (20) through the etch window (29). According to a yet further embodiment, the substrate (21) further comprises a dielectric layer (28) between the body (22) and the pressure sensor element (39) location (43), and wherein the dielectric layer (28) forms a bottom (54) of the final cavity (42). According to a still yet further embodiment, the substrate 21 further comprises a further semiconductor region (30) overlying the dielectric layer (28) and wherein the pressure sensor element (39) location (43) includes a portion of the further semiconductor region (30).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for producing a MEMS device comprising:
   for a substrate having first and second principal surfaces with a desired MEMS element location proximate the first surface, locally anisotropically etching in the substrate a preliminary cavity extending toward the first surface and underlying the desired MEMS element location; and
   exposing the preliminary cavity to tetra-methyl-ammonium hydroxide (TMAH) etchant;
   wherein the substrate comprises a body of semiconductor material, wherein the body of semiconductor material is locally anisotropically etched to produce the preliminary cavity that is subsequently exposed to the TMAH etchant, and wherein the preliminary cavity has preliminary sidewalls extending substantially through or entirely through the body of semiconductor material.

2. The method of claim 1, further comprising prior to the etching step, providing a protective layer over at least the MEMS element location.

3. The method of claim 1, further comprising prior to the etching step, providing a mask layer having an etch window therein on the second surface opposite the desired MEMS element location, and thereafter performing the etching step through the etch window.

4. The method of claim 1, wherein the etching step comprises reactive ion etching.

5. The method of claim 1, further comprising prior to the exposing step, cleaning the preliminary cavity of anisotropic cavity etching byproducts.

6. The method of claim 1, wherein following the exposing step, a subsequent cavity is formed having a sidewall portion making an angle with a bottom of the subsequent cavity in the range of about 20 to less than 90 degrees.

7. The method of claim 1, wherein the TMAH etchant comprises TMAH concentrations in the range of about 2 to 10 weight percent TMAH in water.

8. The method of claim 1, wherein the substrate further comprises a composite layer overlying the body of semiconductor material, wherein exposing comprises contacting the preliminary cavity with the TMAH etchant to produce a final cavity extending through the body of semiconductor material and exposing a central portion of the composite layer, and wherein the exposed central portion of the composite layer acts as a pressure sensor diaphragm of the MEMS device.

9. The method of claim 8, wherein the final cavity includes a sidewall transition portion forming an angle with the exposed central portion of the composite layer between about 50 and about 60 degrees.

10. A method for etching a cavity in a substrate including a pressure sensor diaphragm and a body of semiconductor material, the body of semiconductor material having a first principal surface over which the pressure sensor diaphragm is formed and having a second principal surface opposite the first principal surface, the method comprising:
   anisotropically locally etching a preliminary cavity in the body of semiconductor material extending from the second principal surface toward the first principal surface and underlying the pressure sensor diaphragm; and
   exposing the preliminary cavity to a tetra-methyl-ammonium hydroxide (TMAH) etchant thereby forming a final cavity having a smoother final sidewall, the final cavity extending from the first principal surface to the second principal surface to expose at least a portion of the pressure sensor diaphragm through the body of semiconductor material.

11. The method of claim 10, wherein the smoother final sidewall has a portion making an angle with a surface of the pressure sensor diaphragm in the range of about 20 to less than 90 degrees.

12. The method of claim 10, wherein the TMAH etchant comprises TMAH concentrations in the range of about 2 to 10 weight percent TMAH in water.

13. The method of claim 10, wherein the etching step comprises reactive ion etching.

14. The method of claim 10, further comprising prior to the exposing step, cleaning a preliminary sidewall of the preliminary cavity of anisotropic cavity etching byproducts.

15. The method of claim 14, wherein the cleaning step comprises using a water-hydrofluoric acid mixture having a concentration ratio in the range of about $H_2O:HF=500:1$ to $H_2O:HF=25:1$.

16. A method for producing a pressure sensor device comprising:
   for a substrate having a substantially silicon body, a first principal surface, a second principal surface spaced from the first principal surface, and a pressure sensor element location proximate the first principal surface, locally anisotropically etching a preliminary cavity extending at least partly through the silicon body extending from the second principal surface toward the first principal surface, wherein the preliminary cavity underlies the pressure sensor element location and has a preliminary sidewall; and
   exposing the preliminary sidewall of the preliminary cavity to tetra-methyl-ammonium hydroxide (TMAH) etchant to provide a final cavity extending through the substantially silicon body to expose a portion of the substrate underlying the pressure sensor element location and acting as a pressure sensor diaphragm of the pressure sensor device.

17. The method of claim 16, wherein the final cavity has a final sidewall having a portion making an angle with a bottom of the final cavity in the range of about 20 to less than 90 degrees.

18. The method of claim 16, further comprising prior to the etching step, providing a mask layer on the first principal surface having an etch window therein opposite the pressure sensor element location, and thereafter etching the preliminary cavity through the etch window.

19. The method of claim 16, wherein the substrate further comprises a dielectric layer between the body and the pressure sensor element location, and wherein the dielectric layer forms a bottom of the final cavity.

20. The method of claim 19, wherein the substrate further comprises a further semiconductor region overlying the dielectric layer and wherein the pressure sensor element location includes a portion of the further semiconductor region.

* * * * *